(12) United States Patent
Morita et al.

(10) Patent No.: US 9,299,474 B2
(45) Date of Patent: Mar. 29, 2016

(54) OXIDE FOR SEMICONDUCTOR LAYER OF THIN-FILM TRANSISTOR, SPUTTERING TARGET, AND THIN-FILM TRANSISTOR

(75) Inventors: Shinya Morita, Kobe (JP); Aya Miki, Kobe (JP); Yumi Iwanari, Kobe (JP); Toshihiro Kugimiya, Kobe (JP); Satoshi Yasuno, Kobe (JP); Jae Woo Park, Seongnam (KR); Je Hun Lee, Seoul (KR); Byung Du Ahn, Hwaseong (KR)

(73) Assignee: Samsung Display Co., Ltd., Yongin (KR)

( * ) Notice: Subject to any disclaimer, the term of this patent is extended or adjusted under 35 U.S.C. 154(b) by 99 days.

(21) Appl. No.: 13/812,277

(22) PCT Filed: Jul. 28, 2011

(86) PCT No.: PCT/JP2011/067332
§ 371 (c)(1),
(2), (4) Date: Jan. 25, 2013

(87) PCT Pub. No.: WO2012/014999
PCT Pub. Date: Feb. 2, 2012

(65) Prior Publication Data
US 2013/0119324 A1    May 16, 2013

(30) Foreign Application Priority Data

Jul. 30, 2010  (JP) .................................. 2010-172868
Jan. 18, 2011  (JP) .................................. 2011-008323

(51) Int. Cl.
*H01B 1/08*    (2006.01)
*H01L 29/24*   (2006.01)
(Continued)

(52) U.S. Cl.
CPC .......... *H01B 1/08* (2013.01); *C23C 14/08* (2013.01); *H01L 21/02554* (2013.01); *H01L 21/02565* (2013.01); *H01L 21/02631* (2013.01); *H01L 29/24* (2013.01); *H01L 29/7869* (2013.01)

(58) Field of Classification Search
CPC ............ H01B 1/00; H01B 1/08; C23C 14/08; C23C 14/34
See application file for complete search history.

(56) References Cited

U.S. PATENT DOCUMENTS 3,838,378 A * 9/1974 Matsuoka et al. ............... 338/20
5,026,672 A * 6/1991 Bayard ......................... 501/134
(Continued)

FOREIGN PATENT DOCUMENTS

CN      1918717 A      2/2007
CN      101057338 A    10/2007
(Continued)

OTHER PUBLICATIONS

English language machine translation of JP 2010-070410A (pub 2010).*
(Continued)

*Primary Examiner* — Mark Kopec
(74) *Attorney, Agent, or Firm* — Oblon, McClelland, Maier & Neustadt, L.L.P

(57) ABSTRACT

There is provided an oxide for semiconductor layers of thin-film transistors, which oxide can provide thin-film transistors with excellent switching characteristics and by which oxide favorable characteristics can stably be obtained even after the formation of passivation layers. The oxide to be used for semiconductor layers of thin-film transistors according to the present invention includes Zn, Sn, and Si.

8 Claims, 4 Drawing Sheets

(51) Int. Cl.
 *C23C 14/08* (2006.01)
 *H01L 21/02* (2006.01)
 *H01L 29/786* (2006.01)

(56) References Cited

U.S. PATENT DOCUMENTS

| | | | |
|---|---|---|---|
| 5,972,527 A | 10/1999 | Kaijou et al. | |
| 6,727,522 B1 | 4/2004 | Kawasaki et al. | |
| 6,878,962 B1 | 4/2005 | Kawasaki et al. | |
| 6,936,188 B1 | 8/2005 | Haga | |
| 7,061,014 B2 | 6/2006 | Hosono et al. | |
| 7,067,843 B2 | 6/2006 | Carcia et al. | |
| 7,145,174 B2 | 12/2006 | Chiang et al. | |
| 7,189,992 B2 | 3/2007 | Wager et al. | |
| 7,211,825 B2 | 5/2007 | Shih et al | |
| 7,242,039 B2 | 7/2007 | Hoffman et al. | |
| 7,297,977 B2 | 11/2007 | Hoffman et al. | |
| 7,339,187 B2 | 3/2008 | Wager et al. | |
| 7,393,600 B2 | 7/2008 | Inoue et al. | |
| 7,696,513 B2 | 4/2010 | Hayashi et al. | |
| 7,906,777 B2 | 3/2011 | Yano et al. | |
| 8,154,017 B2 | 4/2012 | Yabuta et al. | |
| 2005/0017244 A1 | 1/2005 | Hoffman et al. | |
| 2006/0108636 A1 | 5/2006 | Sano et al. | |
| 2006/0113536 A1 | 6/2006 | Kumomi et al. | |
| 2006/0113549 A1 | 6/2006 | Den et al. | |
| 2006/0113565 A1 | 6/2006 | Abe et al. | |
| 2007/0023750 A1 | 2/2007 | Chiang et al. | |
| 2007/0052025 A1 | 3/2007 | Yabuta | |
| 2007/0170457 A1 | 7/2007 | Kobayakawa et al. | |
| 2007/0194379 A1 | 8/2007 | Hosono et al. | |
| 2008/0254569 A1 | 10/2008 | Hoffman et al. | |
| 2009/0090914 A1 | 4/2009 | Yano et al. | |
| 2009/0189153 A1 | 7/2009 | Iwasaki et al. | |
| 2009/0267064 A1 | 10/2009 | Yano et al. | |
| 2009/0278122 A1 | 11/2009 | Hosono et al. | |
| 2009/0280600 A1 | 11/2009 | Hosono et al. | |
| 2009/0308635 A1 | 12/2009 | Yano et al. | |
| 2010/0032666 A1 | 2/2010 | Yamazaki et al. | |
| 2010/0108502 A1 | 5/2010 | Inoue et al. | |
| 2010/0155717 A1 | 6/2010 | Yano et al. | |
| 2010/0155721 A1 | 6/2010 | Lee et al. | |
| 2010/0266787 A1 | 10/2010 | Yano et al. | |
| 2011/0001136 A1* | 1/2011 | Hasegawa et al. | 257/43 |
| 2011/0081775 A1 | 4/2011 | Pierreux et al. | |
| 2011/0114942 A1 | 5/2011 | Akimoto et al. | |
| 2011/0121244 A1 | 5/2011 | Yano et al. | |
| 2011/0240988 A1 | 10/2011 | Yano et al. | |
| 2011/0260121 A1 | 10/2011 | Yano et al. | |
| 2012/0138923 A1 | 6/2012 | Hara et al. | |
| 2012/0146021 A1 | 6/2012 | Yabuta et al. | |
| 2013/0032798 A1 | 2/2013 | Miki et al. | |
| 2013/0075720 A1* | 3/2013 | Ahn et al. | 257/43 |
| 2013/0240802 A1* | 9/2013 | Miki et al. | 252/519.15 |
| 2013/0248858 A1 | 9/2013 | Morita et al. | |
| 2013/0270109 A1 | 10/2013 | Morita et al. | |
| 2014/0054588 A1 | 2/2014 | Maeda et al. | |

FOREIGN PATENT DOCUMENTS

| | | |
|---|---|---|
| CN | 101312912 A | 11/2008 |
| CN | 101669208 A | 3/2010 |
| JP | 5-251705 A | 9/1993 |
| JP | 2007 142196 | 6/2007 |
| JP | 4164562 B2 | 8/2008 |
| JP | 4170454 B2 | 8/2008 |
| JP | 2008 277326 | 11/2008 |
| JP | 2009-123957 A | 6/2009 |
| JP | 2010-45263 A | 2/2010 |
| JP | 2010 70410 | 4/2010 |
| JP | 2010 150446 | 12/2010 |
| KR | 10-2008-0069607 A | 7/2008 |
| KR | 10-2008-0074889 A | 8/2008 |
| KR | 10-2011-0124530 A | 11/2011 |
| KR | 10-2011-0128038 A | 11/2011 |
| TW | 200731543 A | 11/1995 |
| TW | 200939470 A | 9/2009 |
| WO | 03/040441 A1 | 5/2003 |
| WO | 2007/032294 A1 | 3/2007 |
| WO | 2007/058232 A1 | 5/2007 |
| WO | 2009/064007 A1 | 5/2009 |

OTHER PUBLICATIONS

International Search Report Issued Nov. 1, 2011 in PCT/JP11/67332 Filed Jul. 28, 2011.
U.S. Appl. No. 14/113,322, filed Oct. 22, 2013, Maeda, et al.
U.S. Appl. No. 14/399,378, filed Nov. 6, 2014, Goto, et al.
Proffit et al.—"X-ray absorption spectroscopy study of the local structures of crystalline Zn-In-Sn oxide thin films", Journal of Applied Physics 106, 113524-113524-6 (2009).
Ryu et al.—"High performance thin film transistor with cosputtered amorphous Zn-In-Sn-O channel: Combinatorial approach", Applied Physics Letters 95, 072104-072104-3 (2009).
Kim et al.—"Effects of Ti addition on sol-gel derived InO and InZnO thin film transistors", Current Applied Physics 12 (2012) e24-e28.
Park et al.—"Low-Temperature Fabrication and Characteristics of Lanthanum Indium Zinc Oxide Thin-Film Transistors", IEEE Electron Device Letters, vol. 33, No. 5, May 2012 pp. 685-687.
Qijun et al.—"Study of Ti addition in channel layers for In-Zn-O thin film transisors", Applied Surface Science 258 (2011), pp. 1460-1463.

* cited by examiner (a) Passivation layer was not formed (b) Passivation layer was formed

OXIDE FOR SEMICONDUCTOR LAYER OF THIN-FILM TRANSISTOR, SPUTTERING TARGET, AND THIN-FILM TRANSISTOR

CROSS REFERENCE TO RELATED APPLICATIONS

The present application is a 35 U.S.C. §371 national stage patent application of International patent application PCT/JP2011/067332, filed on Jul. 28, 2011, published as WO 2012/014999 on Feb. 2, 2012, the text of which is incorporated by reference, and claims the benefit of the filing date of Japanese application nos. JP 2010-172868, filed on Jul. 30, 2010, and JP 2011-008323, filed on Jan. 18, 2011, the text of each also being incorporated by reference.

TECHNICAL FIELD

The present invention relates to an oxide for semiconductor layers of thin-film transistors (TFTs) to be used in display devices such as liquid crystal displays and organic EL displays; a sputtering target for forming an oxide as described above into a film; and a thin-film transistor.

BACKGROUND ART

As compared with widely used amorphous silicon (a-Si), amorphous (non-crystalline) oxide semiconductors have high carrier mobility (also called as field-effect mobility, which may hereinafter be referred to simply as "mobility"), high optical band gaps, and film formability at low temperatures, and therefore, have highly been expected to be applied for next generation displays, which are required to have large sizes, high resolution, and high-speed drives; resin substrates having low heat resistance; and others.

Examples of the oxide semiconductors may include In-containing amorphous oxide semiconductors (e.g., In—Ga—Zn—O, In—Zn—O); however, since these oxide semiconductors contain In which is a rare metal, an increase in material cost is a serious concern in mass production process. Thus, as oxide semiconductors which contain no In, which can be produced at low material cost, and which are suitable for mass production, Zn—Sn—O (which may be represented by ZTO) oxide semiconductors made amorphous by addition of Sn to Zn have been proposed (e.g., Patent Document 1).

When an oxide semiconductor is used as a semiconductor layer of a thin-film transistor, the oxide semiconductor is required to have a high carrier concentration (mobility) and excellent TFT switching characteristics (transistor characteristics or TFT characteristics). More specifically, the oxide semiconductor is required to have, for example, (1) a high ON current (i.e., the maximum drain current when a positive voltage is applied to both a gate electrode and a drain electrode); (2) a low OFF current (i.e., a drain current when a negative voltage is applied to the gate electrode and a positive voltage is applied to the drain voltage, respectively); (3) a low S value (Subthreshold Swing, i.e., a gate voltage needed for a one-digit increase of the drain current); (4) a stable threshold value (i.e., a voltage at which the drain current starts to flow when a positive voltage is applied to the drain voltage and either a positive voltage or a negative voltage is applied to the gate voltage, which voltage may also be called as a threshold voltage) showing no change with time (which means that the threshold voltage is even in the substrate surface); and (5) a high mobility.

A particularly important one as showing TFT performance in the requirements described above is (5) mobility; and higher mobility provides higher TFT switching speed, so that higher performance transistors can be obtained. In recent years, display devices such as liquid crystal devices have rapidly proceeded to have large screens, high definition, high-speed drives, and others, with which semiconductor materials having high mobility have been eagerly desired. In this regard, mobility $\mu(cm^2/Vs)$ is defined by the expression: $V=\mu E$ using the speed V (cm/s) of carriers such as electrons and holes and the electric field E (V). Therefore, an increase in mobility needs a reduction in the content of defects in the semiconductor film to inhibit carrier scattering and lengthen carrier mean free path.

In this regard, carrier density can be adjusted by controlling the content of oxygen defects contained in the oxide semiconductor film. As the method of controlling the content of oxygen defects, there can be mentioned, for example, a method of adjusting the oxygen partial pressure in the process gas to be used when an oxide semiconductor film is formed by sputtering and a method of carrying out heat treatment in an oxygen or air atmosphere after the formation of an oxide semiconductor layer.

On the other hand, when an oxide semiconductor is applied to display devices and others, the securement of stable TFT characteristics needs the formation of a passivation layer on the surface of the oxide semiconductor. In general, insulator oxides such as $SiO_x$, $SiN_x$, SiON, and $AlO_x$ can be used as a passivation layer. For the formation of a passivation layer as described above, plasma CVD, sputtering, and other methods have widely been used. For example, the formation of a $SiO_x$ passivation layer by plasma CVD method is carried out, for example, by a method of depositing $SiO_x$ on the oxide semiconductor film, which $SiO_x$ is formed by the reaction of a mixed gas of $SiH_4$ and $N_2O$ in the high-frequency plasma with an industrial frequency of 13.56 MHz.

However, if a passivation layer is formed by plasma CVD, sputtering, or other methods, radicals and molecules made to have high speed by plasma or others will collide to the surface of an oxide semiconductor; therefore, some defects may be formed in the surface of the oxide semiconductor. More specifically, the collision of gas components to be used in the formation of a passivation layer by plasma CVD or sputtering method, molecules accelerated to high speed by sputtering, and others, to the surface of the oxide semiconductor, thereby causing a phenomenon of desorption of oxygen contained in the oxide semiconductor (i.e., oxygen defects). These oxygen defects seriously affect TFT characteristics, such as an excessive carrier increase in the oxide semiconductor film, by which the oxide semiconductor film becomes conductive, thereby making it impossible to obtain stable switching characteristics, and by which a threshold voltage largely shifts to the negative side.

The explanation of an excessive carrier increase caused by oxygen defects was described above, but the same problem will occur in the case of hydrogen. For example, the diffusion of hydrogen, which is contained in a passivation layer such as made of $SiO_x$ or $SiN_x$, into an oxide semiconductor film causes an excessive carrier increase, which adversely affects TFT characteristics.

To reduce such a deterioration in TFT characteristics due to oxygen and hydrogen, for example, non-patent literature document 1 proposes a method of excessively oxidizing an oxide semiconductor surface in advance by irradiating the oxide semiconductor surface with $N_2O$ plasma just before the formation of a passivation layer. However, this method is quite difficult in tuning because it is difficult to adjust conditions (e.g., input electric power, time, substrate temperature) for the irradiation of $N_2O$ plasma and because the irradiation conditions described above need to be adjusted according to the formation conditions and quality of a passivation layer and further according to the quality of an oxide semiconductor. In addition, a method as described above has a narrow process margin, possibly resulting in a decrease in yield, such as a variation in the substrate surface when TFT is produced with a large substrate and a change in TFT characteristics for each batch. Further, a method as described above may also cause other problems such as a decrease in productivity and an increase in production cost, for example, a need for the addition of a chamber for $N_2O$ plasma treatment before the formation of a passivation layer.

PRIOR ART DOCUMENTS

Patent Document

Patent Document 1: Japanese Patent Laid-open Publication No. 2007-142196

Non-Patent Literature Document

Non-patent Literature Document: J. Park et al., Appl. Phys. Lett., 1993, 053505 (2008)

SUMMARY OF THE INVENTION

Problems to be Solved by the Invention

As described above, oxide semiconductors such as ZTO have a problem that a semiconductor layer becomes conductive in the process of forming a passivation layer (or insulating layer) of a TFT device, thereby making it impossible to obtain a stable switching behavior.

The present invention has been completed under the circumstances described above, and an object thereof is to provide an oxide for semiconductor layers of thin-film transistors, which oxide can provide a thin-film transistor containing a ZTO-based oxide semiconductor with excellent switching characteristics, which oxide can particularly prevent TFT characteristics from being deteriorated by the formation of a passivation layer or the formation of a source-drain electrode, thereby making it possible to stably obtain excellent TFT characteristics, and further, which oxide can attain a reduction in cost and an improvement in yield; and a sputtering target to be used for the formation of an oxide as described above; and a thin-film transistor using an oxide as described above.

Means for Solving the Problems

The present invention provides oxides for semiconductor layers of thin-film transistors, thin-film transistors, and sputtering targets as described below.

(1) An oxide for a semiconductor layer of a thin-film transistor, the oxide comprising Zn, Sn, and Si.

(2) The oxide as described in (1), wherein the ratio of [Zn]/([Zn]+[Sn]) is 0.8 or lower where [Zn] and [Sn] indicate the content (atomic %) of Zn and the content (atomic %) of Sn, respectively, both contained in the oxide for the semiconductor layer.

(3) The oxide as described in (1), wherein the ratio of [Si]/([Zn]+[Sn]+[Si]) is from 0.01 to 0.30 where [Si] indicates the content (atomic %) of Si contained in the oxide for the semiconductor layer.

(4) The oxide as described in (2), wherein the ratio of [Si]/([Zn]+[Sn]+[Si]) is from 0.01 to 0.30 where [Si] indicates the content (atomic %) of Si contained in the oxide for the semiconductor layer.

(5) A thin-film transistor comprising an oxide as described in any one of (1) to (4) as a semiconductor layer of the thin-film transistor.

(6) The thin-film transistor as described in (5), wherein the semiconductor layer has a density of 5.8 g/cm$^3$ or higher.

(7) A sputtering target for forming an oxide as described in any one of (1) to (4), the sputtering target comprising Zn, Sn, and Si.

(8) The sputtering target as described in (7), wherein the ratio of [Zn]/([Zn]+[Sn]) is 0.8 or lower where [Zn] and [Sn] indicate the content (atomic %) of Zn and the content (atomic %) of Sn, respectively, both contained in the sputtering target.

(9) The sputtering target as described in (7), wherein the ratio of [Zn]/([Zn]+[Sn]+[Si]) is from 0.01 to 0.30 where [Si] indicates the content (atomic %) of Si contained in the sputtering target.

(10) The sputtering target as described in (8), wherein the ratio of [Zn]/([Zn]+[Sn]+[Si]) is from 0.01 to 0.30 where [Si] indicates the content (atomic %) of Si contained in the sputtering target.

Effects of the Invention

According to the present invention, ZTO-based oxides for semiconductor layers are obtained, which can provide thin-film transistors with excellent switching characteristics. When the oxides for semiconductor layers according to the present invention are used, thin-film transistors can be provided, of which TFT characteristics can be prevented from being deteriorated by the formation of oxygen defects due to plasma damage, the diffusion of hydrogen from passivation layers, and other factors, in the formation of the passivation layers on oxide semiconductor films, thereby stably obtaining favorable characteristics. As a result, the use of thin-film transistors as described above makes it possible to obtain highly-reliable display devices.

MODE FOR CARRYING OUT THE INVENTION

Figure 1:
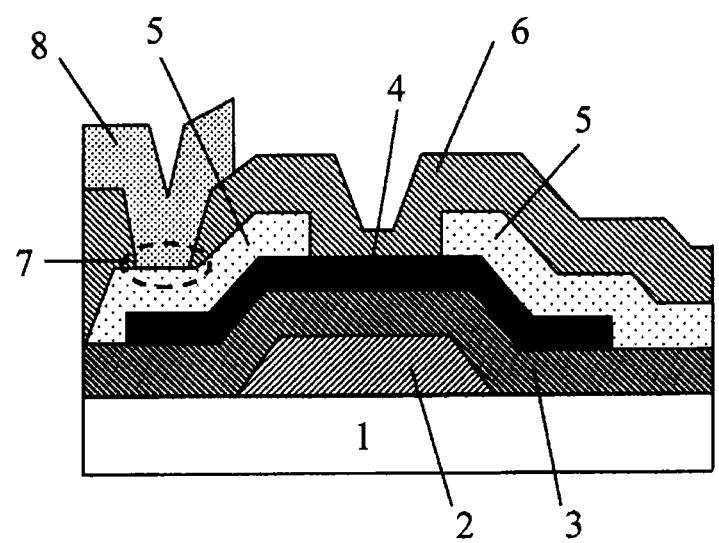
FIG. 1 is a schematic cross-sectional view for the explanation of a thin-film transistor containing an oxide semiconductor.

The present inventors have made various studies to improve TFT characteristics (particularly, TFT characteristics after the formation of passivation layers) when oxides containing Zn and Sn (Zn—Sn—O) are used for active layers (semiconductor layers) of TFTs. As a result, they have found that an intended object can be accomplished by the use of oxides containing Si in ZTO (Zn—Sn—Si—O) for semiconductor layers of TFTs, thereby completing the present invention. As shown in Examples described below, TFTs using Zn—Sn—Si—O for oxide semiconductors have been found to have quite excellent TFT characteristics, particularly after the formation of passivation layers, as compared with the case of using conventional Zn—Sn—O to which Si is not added.

That is, the oxides for semiconductor layers of thin-film transistors (TFTs) according to the present invention are characterized in that they contain Zn, Sn, and Si. In this Description, the oxides of the present invention may be represented by ZTO–Si or ZTO+Si.

First, the following will explain metals (Zn and Sn) as the mother components constituting the oxides of the present invention.

Regarding the metals described above (i.e., Zn and Sn), the ratio of these metals is not particularly limited, so long as oxides containing these metals (Zn—Sn—O) have an amorphous phase and fall within the category of showing semiconductor characteristics. The formation of a crystalline phase causes some problem, for example, a problem that transistor characteristics become significantly uneven.

In this regard, the ratio of [Zn]/([Zn]+[Sn]) (which may hereinafter be represented by the Zn ratio) may preferably be 0.8 or lower where [Zn] and [Sn] indicate the content (atomic %) of Zn and the content (atomic %) of Sn, respectively, both contained in the oxide for semiconductor layers, thereby obtaining desired TFT characteristics even after the formation of passivation layers. On the other hand, when a ratio as described above is too low, some problems occur, such as a problem that etching properties may be lowered, and therefore, a ratio as described above may preferably be 0.2 or higher. A ratio as described above may more preferably be from 0.3 to 0.75.

The oxides of the present invention are characterized in that they contain Si in Zn—Sn—O. The addition of Si makes it possible to prevent TFT characteristics from being deteriorated by the formation of oxygen defects on the oxide surface due to plasma damage, the diffusion of hydrogen from passivation layers, and other factors, and also makes it possible to maintain favorable characteristics even after the formation of the passivation layers. More specifically, it is assumed that the structures of oxide semiconductor layers are stabilized by the addition of Si, which is a highly-covalent element and which can strongly bond to oxygen as compared with Zn and Sn.

In addition, the addition of Si makes it possible to prevent mobility from being decreased by the introduction of impurities. When impurities are introduced into Zn—Sn—O oxide semiconductors, the mean free path of electrons is shortened by impurity scattering, and therefore, mobility is decreased with an increase in the content of impurities. However, when the Zn—Sn—Si—O oxide semiconductors of the present invention, obtained by the addition of Si to Zn—Sn—O oxide semiconductors, are used, a decrease in mobility is difficult to occur as shown in Examples described below, and the effects described above (i.e., the effects of preventing the formation of oxygen defects and the diffusion of hydrogen as described above) can be exhibited, while maintaining high mobility.

The preferable ratio, [Si]/([Zn]+[Sn]+[Si]) (which may hereinafter be represented by the Si ratio), of Si contained in all metal elements (Zn, Sn, and Si) constituting the oxides (ZTO–Si) of the present invention can be determined taking into consideration the conditions for the formation of passivation layers, carrier density, and other factors, and the Si ratio may preferably be approximately from 0.01 to 0.30. In this regard, when a Si ratio as described above is too high, the carrier density or mobility in semiconductors may be decreased, resulting in a tendency of an ON current to lower easily, and therefore, the upper limit of a Si ratio as described above may more preferably be 0.2 or lower, still more preferably be 0.1 or lower.

In the present invention, mobility may preferably be 10 $cm^2/Vs$ or higher, more preferably 13 $cm^2/Vs$ or higher, and still more preferably 15 $cm^2/Vs$ or higher, in a linear region.

The oxides of the present invention were explained above.

An oxide as described above may preferably be formed into a film by a sputtering method using a sputtering target (which may hereinafter be referred to as the "target"). The oxide can also be formed into a film by a chemical film-formation method such as a coating method. The sputtering method makes it easy to form a thin film having excellent in-plain uniformity of composition and thickness.

As a target to be used in the sputtering method, there may preferably be used a target containing the elements described above and having the same composition as that of a desired oxide, thereby making it possible to form a thin film having the same composition as that of the desired oxide. More specifically, as the target, there can be used an oxide target containing Zn, Sn, and Si, preferably a target in which both a Zn ratio and a Si ratio as described above are appropriately controlled.

Alternatively, the formation of a film may also be carried out by a co-sputtering method in which two targets having different compositions are simultaneously discharged, and an oxide semiconductor film having a desired composition can be formed by adjusting the densities of input electric powers to be applied to the respective targets at the time of discharge. Alternatively, for example, a desired Zn—Sn—Si—O oxide film can be formed by a co-sputtering method using three targets, i.e., a target of ZnO, a target of $SnO_2$, and a target of $SiO_2$ or any other target containing Si.

A target as described above can be produced, for example, by a powder sintering method.

The sputtering using a target as described above may preferably be carried out under the conditions that substrate temperature is set to room temperature and oxygen addition amount is appropriately controlled. The oxygen addition amount may appropriately be controlled according to the configuration of a sputtering system, the composition of the target, and others. The oxygen addition amount may preferably be controlled by the addition of oxygen so that the carrier concentration of an oxide semiconductor becomes approximately $10^{15}$ to $10^{16}$ $cm^{-3}$. The oxygen addition amount in Examples was controlled so as to satisfy the expression: $O_2/(Ar+O_2)=2\%$ by addition flow ratio.

Further, when an oxide as described above is used as a semiconductor layer of a TFT, the oxide semiconductor layer may preferably have a density of 5.8 $g/cm^3$ or higher (described below). To form a film of such an oxide, the sputtering conditions may preferably be controlled in an appropriate manner, such as gas pressure, input power to be applied to a sputtering target(s), and substrate temperature during film formation by sputtering. For example, when the gas pressure is lowered during film formation, sputtered atoms can be prevented from scattering one another, thereby making it possible to form a dense (high-density) film. Thus, the total gas pressure during film formation may preferably be as low as possible to an extent that sputtering discharge is stabilized, and it may preferably be controlled in a range of approximately from 0.5 mTorr to 5 mTorr, more preferably in a range of approximately from 1 mTorr to 3 mTorr. Further, the input power may preferably be as high as possible, and it is recommended to be set to about 2.0 W/cm$^2$ or higher in DC or RF mode. The substrate temperature during film formation may preferably be as high as possible, and it is recommended to be set to a range of approximately from room temperature to 200° C.

The layer thickness of an oxide formed into a layer as described above may preferably be from 30 nm to 200 nm, more preferably from 30 nm to 150 nm.

The present invention further encompasses TFTs each containing an oxide as described above, as a semiconductor layer of each TFT. The TFTs may respectively have at least a gate electrode, a gate insulator layer, a semiconductor layer made of an oxide as described above, a source electrode, a drain electrode, and a passivation layer (or insulator layer) on a substrate. The configuration thereof is not particularly limited, so long as it is usually used.

An oxide semiconductor layer as described above may preferably have a density of 5.8 g/cm$^3$ or higher. An increase in the density of the oxide semiconductor layer causes both a decrease in the content of defects in the film to improve the film quality and a decrease in atomic distance to largely increase field-effect mobility of each TFT device, thereby increasing electric conductivity and improving stability to stress against light irradiation. The oxide semiconductor layer may preferably have a density as higher as possible, more preferably 5.9 g/cm$^3$ or higher, and still more preferably 6.0 g/cm$^3$ or higher. In this regard, the density of the oxide semiconductor layer is measured by a method described below in Examples.

The following will explain, by reference to FIG. 1, embodiments of a method for producing a TFT as described above. FIG. 1 and the following production method indicate one example of preferred embodiments of the present invention, and they are not intended to limit the present invention. For example, FIG. 1 shows a TFT having a bottom gate type structure; however, the present invention is not limited thereto, and the TFTs of the present invention may be top gate type TFTs each having a gate insulator layer and a gate electrode successively on an oxide semiconductor layer.

As shown in FIG. 1, a gate electrode 2 and a gate insulator layer 3 are formed on a substrate 1, and an oxide semiconductor layer 4 is formed thereon. A source-drain electrode 5 is formed on the oxide semiconductor layer 4, and a passivation layer (or insulator layer) 6 is formed thereon, and a transparent conductive film 8 is electrically connected to the drain electrode 5 through a contact hole 7.

The method for forming the gate electrode 2 and the gate insulator layer 3 on the substrate 1 is not particularly limited, and any of the methods usually used can be employed. Further, the kinds of the gate electrode 2, and the gate insulator layer 3 are not particularly limited, and there can be used those which have widely been used. For example, metals having low electric resistance, such as Al and Cu, and their alloys, can preferably be used for the gate electrode 2. Typical examples of the gate insulator layer 3 may include a silicon oxide film, a silicon nitride film, and a silicon oxynitride film. In addition, there can also be used oxides such as Al$_2$O$_3$ and Y$_2$O$_3$, and those which are formed by layering them.

Then, the oxide semiconductor layer 4 is formed. The oxide semiconductor layer 4 may preferably be formed by a DC sputtering method or an RF sputtering method using a sputtering target having the same composition as that of the thin film, as described above. Alternatively, the film formation may be carried out by a co-sputtering method.

The oxide semiconductor layer 4 is subjected to wet etching and then patterning. Just after the patterning, heat treatment (or pre-annealing) may preferably be carried out for the purpose of improving the quality of the oxide semiconductor layer 4, resulting in an increase in the ON current and field-effect mobility of transistor characteristics and an improvement in transistor performance.

After the pre-annealing, the source-drain electrode 5 is formed. The kind of the source-drain electrode 5 is not particularly limited, and there can be used those which have widely been used. For example, similarly to the gate electrode 2, metals such as Al and Cu or their alloys may be used, or pure Ti may also be used as in Examples described below.

The method for forming the source-drain electrode 5 can be carried out, for example, as follows: a metal thin film is formed by a magnetron sputtering method and the source-drain electrode 5 is then formed from the metal thin film by a lift-off method. Alternatively, there is also a method in which a prescribed metal thin film is previously formed by a sputtering method and the electrode is then formed from the metal thin film by patterning, not formed by a lift-off method as described above. However, this method may possibly damage the oxide semiconductor layer when the electrode is etched, resulting in a deterioration in transistor characteristics. Therefore, to avoid such a problem, there is also used a method in which a passivation layer is previously formed on the oxide semiconductor layer and the electrode is then formed by patterning, and this method is used in Examples described below.

Then, the passivation layer (or insulator layer) 6 is formed on the oxide semiconductor layer 4 by a CVD (Chemical Vapor Deposition) method. The surface of the oxide semiconductor layer 4 may easily become conductive due to plasma-induced damage by CVD (this seems to be because oxygen defects formed on the surface of the oxide semiconductor become electron donors), and to avoid the problem described above, N$_2$O plasma irradiation was carried out before the formation of the passivation layer in Examples described below. The conditions described in the non-patent literature document 1 were employed as the N$_2$O plasma irradiation conditions.

Then, according to a conventional method, the transparent conductive film 8 is electrically connected to the drain electrode 5 through the contact hole 7. The kinds of the transparent conductive film and drain electrode are not particularly limited, and there can be used those which have usually be used. For the drain electrode, there can be used, for example, materials exemplified for the source-drain electrode described above.

EXAMPLES

The present invention will hereinafter be described more specifically by way of Examples, but the present invention is not limited to the following Examples. The present invention can be put into practice after appropriate modifications or variations within a range meeting the gist described above and below, all of which are included in the technical scope of the present invention.

Example 1

According to a method as described above, a thin-film transistor (TFT) shown in FIG. 1 was produced, and TFT characteristics before and after the formation of a passivation layer were evaluated.

First, a Ti thin film having a thickness of 100 nm as a gate electrode and a gate insulator layer of SiO$_2$ (having a thickness of 200 nm) were successively formed on a glass substrate ("EAGLE 2000" available from Corning Incorporated, having a diameter 100 mm and a thickness of 0.7 mm). The gate electrode was formed using a pure Ti sputtering target by a DC sputtering method under the conditions: film formation temperature, room temperature; film formation power, 300 W; carrier gas, Ar; and gas pressure, 2 mTorr. Further, the gate insulator layer was formed by a plasma CVD method under the conditions: carrier gas, a mixed gas of $SiH_4$ and $N_2O$; film formation power, 100 W; and film formation temperature, 300° C.

Then, oxide thin films having various compositions as shown in Tables 1 and 2 were formed by a sputtering method using sputtering targets (described below). As the oxide thin films, ZTO–Si (Examples of the present invention) containing Si in Zn—Sn—O was formed, and ZTO containing no Si (Conventional Examples) and ZTO–Ni (Comparative Example) containing Ni in place of Si were also formed for comparison. An apparatus used for the sputtering was "CS-200" available from ULVAC, Inc. and the sputtering conditions were as follows:

Substrate temperature: room temperature
Gas pressure: 5 mTorr
Oxygen partial pressure: $O_2/(Ar+O_2)=2\%$
Film thickness: 50 nm
Size of target used: 4 inch in diameter×5 mm in thickness The film formation of Zn—Sn—O (Conventional Examples) was carried out by a co-sputtering method in which an oxide target (Zn—Sn—O) having a Zn/Sn ratio (atomic % ratio) of 6:4 and a ZnO target were simultaneously discharged. The film formation of Zn—Sn—Si—O or Zn—Sn—Ni—O was carried out by a co-sputtering method in which the targets used in the film formation of ZTO as described above (i.e., the oxide target (ZTO) having a Zn/Sn ratio (atomic % ratio) of 6:4 and the ZnO target) and an oxide target of $SiO_2$ or NiO were simultaneously discharged. In this regard, the density of input electric power was adjusted so that the Si ratio in the Zn—Sn—Si—O or the Ni ratio in the Zn—Sn—Ni—O fell in the range shown in Table 1 or 2.

The contents of the respective metal elements in the oxide thin films thus obtained were analyzed by XPS (X-ray Photoelectron Spectroscopy). More specifically, after sputtering to a depth of about 1 nm from the outermost surface by Ar ion, the analysis was carried out under the following conditions:

X-ray source: Al $K_\alpha$
X-ray output: 350 W
Photoelectron take-off angle: 20°

After each oxide thin film was formed in the manner described above, patterning was carried out by photolithography and wet etching. A wet etchant used was "ITO-07N" available from Kanto Chemical Co., Inc. In this Example, the wet etchability of each oxide thin film subjected to Experiments was evaluated by optical microscopic observation. It has been confirmed according to the evaluation results that no residue by wet etching was observed in all of the compositions subjected to Experiments and etching was appropriately carried out.

After patterning of each oxide semiconductor film, pre-annealing treatment was carried out to improve the film quality. The pre-annealing was carried out at 350° C. under atmospheric pressure for 1 hour.

Then, a source-drain electrode was formed by a lift-off method using pure Ti. More specifically, after patterning was carried out using a photoresist, a Ti thin film (having a thickness of 100 nm) was formed by a DC sputtering method. The method for forming the Ti thin film for a source-drain electrode was the same as that used in the case of the gate electrode described above. Then, an unnecessary photoresist was removed with an ultrasonic washing apparatus in acetone, resulting in a TFT having a channel length of 10 μm and a channel width of 200 μm.

After the source-drain electrode was formed as described above, a passivation layer was formed to protect each oxide semiconductor layer. As the passivation layer, there was used a layered film (having the total thickness of 400 nm) of $SiO_2$ (having a thickness of 200 nm) and SiN (having a thickness of 200 nm). Both $SiO_2$ and SiN as described above were formed by a plasma CVD method using "PD-220NL" available from SAMCO Inc. In this Example, after plasma treatment was carried out by $N_2O$ gas, the $SiO_2$ film and the SiN film were successively formed. A mixed gas of $N_2O$ and $SiH_4$ was used for the formation of the $SiO_2$ film and a mixed gas of $SiH_4$, $N_2$ and $NH_3$ was used for the formation of the SiN film. In both cases, the film formation power was set to 100 W and the film formation temperature was set to 150° C.

Then, a contact hole to be used for probing to evaluate transistor characteristics was formed in the passivation layer by photolithography and dry etching. Then, an ITO film (having a thickness of 80 nm) was formed using a DC sputtering method under the following conditions: carrier gas, a mixed gas of argon gas and oxygen gas; film formation power, 200 W; and gas pressure, 5 mTorr. Thus, TFTs such as shown in FIG. 1 were produced.

Figure 2:
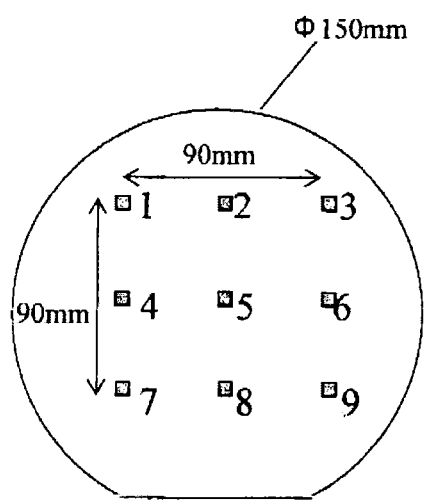
FIG. 2 is a view for the explanation of points at which transistor characteristics, threshold voltage, S value, and mobility were measured in Example 1.
Figure 3:
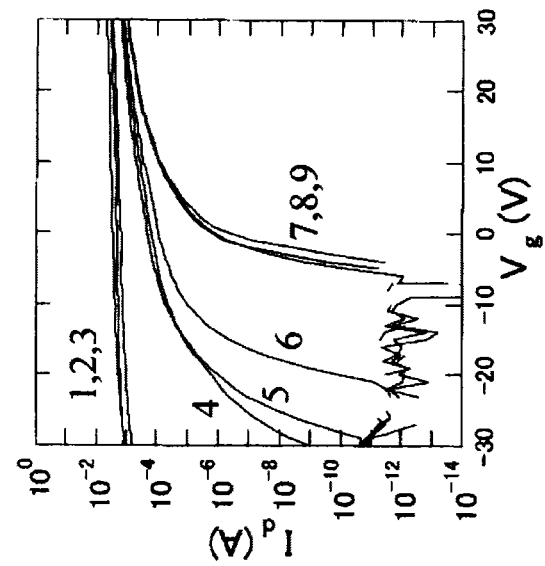
FIGS. 3(a) and 3(b) are graphs showing TFT characteristics before and after the formation of a passivation layer, respectively, when using a Conventional Example (Zn—Sn—O, ZTO).
Figure 3:
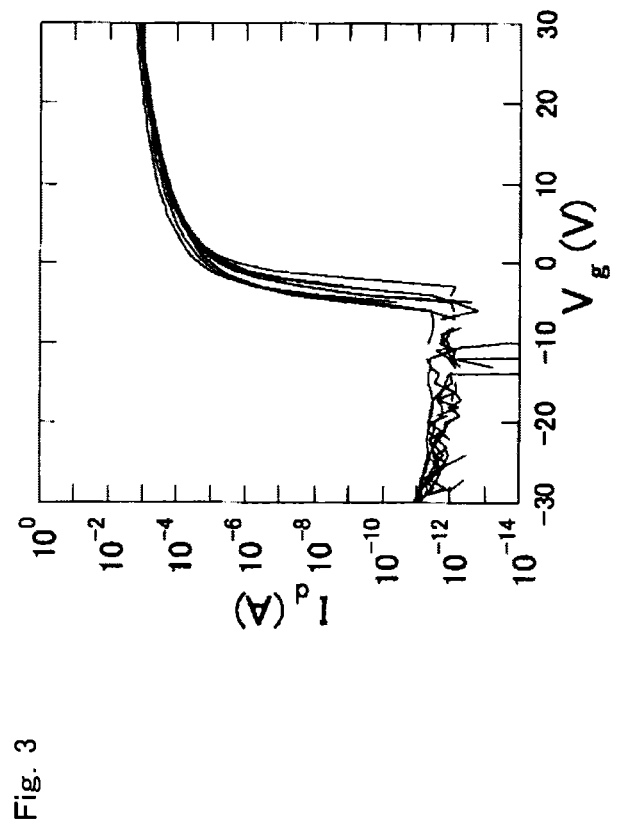

For each of the TFTs thus obtained, the following measurements: (1) transistor characteristics (drain current-gate voltage characteristics, $I_d$-$V_g$ characteristics), (2) threshold voltage, (3) S value, and (4) field-effect mobility before and after the formation of the passivation layer, were carried out as described below. In this Example, for nine positions in the surface of the 6-inch substrate (having a diameter of 150 mm) as shown in FIG. 2, the minimum and maximum values were determined when the following measurements (1) to (4) were carried out, and a variation in the substrate surface was evaluated.

(1) Measurement of Transistor Characteristics

The transistor characteristics were measured using a semiconductor parameter analyzer, "4156C" available from National Instruments Inc. The detailed measurement conditions were as follows:

Source voltage: 0 V
Drain voltage: 10 V
Gate voltage: −30 to 30 V (measurement interval: 1 V)

(2) Threshold Voltage ($V_{th}$)

The threshold voltage is roughly a value of the gate voltage at the time when the transistor is sifted from the OFF state (the state where a drain current is low) to the ON state (the state where a drain current is high). In this Example, the voltage when the drain current is around 1 nA between the ON current and the OFF current was defined as the threshold voltage, and the threshold voltage of each TFT was measured.

(3) S Value

The S value was defined as the minimum value of the gate voltage necessary for increasing the drain current by one digit.

(4) Field-Effect Mobility

The field-effect mobility was derived from the TFT characteristics in a linear region where $V_g > V_d - V_{th}$. In the linear region, the filed-effect mobility is derived by the following expression where $V_g$ and $V_d$ are the gate electrode and drain electrode, respectively, $I_d$ is the drain current, L and W are the channel length and channel width of a TFT device, respectively, $C_i$ is the capacitance of the gate insulator layer, and $\mu_{FE}$ is the field-effect mobility. In this Example, the field-effect mobility $\mu_{FE}$ was derived from a gradient of drain current-gate voltage characteristics ($I_d$-$V_g$ characteristics) around gate voltages falling in the linear region.

$$\mu_{FE} = \frac{\partial I_d}{\partial V_g}\left(\frac{L}{C_i W V_d}\right) \quad \text{[Mathematical Expression 1]}$$

These results are shown in Tables 1 and 2, FIGS. 3(a) and 3(b), and FIGS. 4(a) and 4(b). These Tables were provided with the column entitled "Mobility judgment" in which those having the minimum mobility of 10 cm²/Vs or higher and having a difference between the maximum value and the minimum value, which difference was restricted to the range of 6 or lower, resulting in a small variation in the substrate surface, were evaluated as "o" and the others, as "x". Further, with respect to $V_{th}$, these Tables were provided with the column entitled "$V_{th}$ variation" in which a difference between the maximum value and the minimum value was written for each Example, and these Tables were provided with the column entitled "$V_{th}$ variation judgment" in which those each having a $V_{th}$ variation as described above of 10 or lower, resulting in a small variation in the substrate surface, were evaluated as "o" and the others, as "x". In addition, these Tables were provided with the column entitled "Total judgment" in which those being favorable in all the characteristics were evaluated as "o" and those being inferior in any one of the characteristics, as "x".

First, when a conventional ZTO was used, there were not found any large change in mobility before and after the formation of the passivation layer as shown in Nos. 1 and 3, but the S value and the threshold voltage $V_{th}$ were largely varied after the formation of the passivation layer, in which some point $V_{th}$ was lower than −30 V, thereby not functioning as a switching device (in which case the $V_{th}$ variation was judged as "x").

Further, FIGS. 3(a) and 3(b) show the results obtained when the sample described above (in which the Zn ratio was 0.60) was used and a change in the distribution of TFT characteristics in the substrate surface were examined before and after the formation of the passivation layer. FIG. 3(a) is a graph showing the results before the formation of the passivation layer, and corresponds to No. 1 in Table 1 described above. FIG. 3(b) is a graph showing the results after the formation of the passivation layer, and corresponds to No. 3 in Table 1 described above. In FIG. 3(b), the numerals in this figure indicate the measurement points in FIG. 2 (points 1 to 9).

As can be seen from FIG. 3(a), the drain current $I_d$ increased by about 8 digits with a change in the gate voltage $V_g$ from −30 V to 30 V, indicating favorable switching characteristics, before the formation of the passivation layer. In addition, with respect to a distribution of characteristics in the substrate surface, the threshold voltage fell with a range of from −5 V to −2 V.

TABLE 1

| No. | Composition | [X]/([X] + [Zn] + [Sn]) X: X = Si or Ni | Passivation layer | Mobility (cm²/Vs) | Mobility judgment | S value | Vth (V) | Vth variation (V) | Vth variation judgment | Total judgment |
|---|---|---|---|---|---|---|---|---|---|---|
| 1 | Zn—Sn—O | 0.00 | not formed | 20 to 24 | ○ | 0.4 to 0.5 | −5 to −2 | 3 | ○ | ○ |
| 2 | Zn—Sn-5 at % Si—O | 0.05 | not formed | 15 to 19 | ○ | 0.3 to 0.5 | −2 to 0 | 2 | ○ | ○ |
| 3 | Zn—Sn—O | 0.00 | formed | 19 to 24 | ○ | >0.6 | <−30 to −2 | ≥32 | X | X |
| 4 | Zn—Sn-5 at % Si—O | 0.05 | formed | 15 to 20 | ○ | 0.4 to 0.9 | −10 to −2 | 8 | ○ | ○ |
| 5 | Zn—Sn-1 at % Si—O | 0.01 | formed | 15 to 20 | ○ | 0.4 to 0.9 | −10 to −2 | 8 | ○ | ○ |
| 6 | Zn—Sn-10 at % Si—O | 0.10 | formed | 14 to 18 | ○ | 0.4 to 0.9 | −8 to −2 | 6 | ○ | ○ |
| 7 | Zn—Sn-22 at % Si—O | 0.22 | formed | 11 to 14 | ○ | 0.4 to 0.9 | −8 to −2 | 6 | ○ | ○ |
| 8 | Zn—Sn-28 at % Si—O | 0.28 | formed | 10 to 13 | ○ | 0.5 to 1.0 | −6 to −1 | 5 | ○ | ○ |
| 9 | Zn—Sn-34 at % Si—O | 0.34 | formed | 6 to 9 | X | 0.6 to 1.0 | −5 to −2 | 3 | ○ | X |
| 10 | Zn—Sn-10 at % Ni—O | 0.10 | formed | 3 to 5 | X | 0.4 to 0.8 | <−30 to −8 | ≥22 | X | X |

TABLE 2

| No. | [Zn]/([Zn] + [Sn]) ratio | Passivation layer | Mobility (cm²/Vs) | Mobility judgment | S value | Vth (V) | Vth variation (V) | Vth variation judgment | Total judgment |
|---|---|---|---|---|---|---|---|---|---|
| 1 | 0.40 | formed | 16 to 20 | ○ | 0.4 to 0.8 | −10 to −4 | 6 | ○ | ○ |
| 2 | 0.60 | formed | 15 to 20 | ○ | 0.4 to 0.9 | −10 to −2 | 8 | ○ | ○ |
| 3 | 0.67 | formed | 15 to 20 | ○ | 0.4 to 0.8 | −9 to −2 | 7 | ○ | ○ |
| 4 | 0.75 | formed | 15 to 21 | ○ | 0.5 to 0.9 | −10 to −3 | 7 | ○ | ○ |
| 5 | 0.80 | formed | 16 to 20 | ○ | 0.5 to 0.9 | −8 to −2 | 6 | ○ | ○ |
| 6 | 0.90 | formed | X: no switching | X | — | — | — | — | X |

First, the data in Table 1 will be discussed. Table 1 shows examples, all in which the atomic ratio of [Zn] to [Zn]+[Sn] (i.e., the Zn ratio) was 0.60 (constant). In these examples, Nos. 1 and 3 are examples using a conventional ZTO (without addition of Si), and Nos. 1 and 3 show the results before and after the formation of the passivation layer, respectively. In addition, No. 10 is an example in which Ni was added in place of Si.

On the other hand, as can be seen from FIG. 3(b), TFT characteristics largely varied in the substrate surface; favorable switching characteristics were shown at some points such as points 7 to 9, whereas switching characteristics were not shown at all at points 1 to 3, indicating that the oxide semiconductor layer was made conductive, after the formation of the passivation layer. This seems to be because the surface of the oxide semiconductor layer was damaged by plasma irradiation in the formation of the passivation layer.

Figure 4:
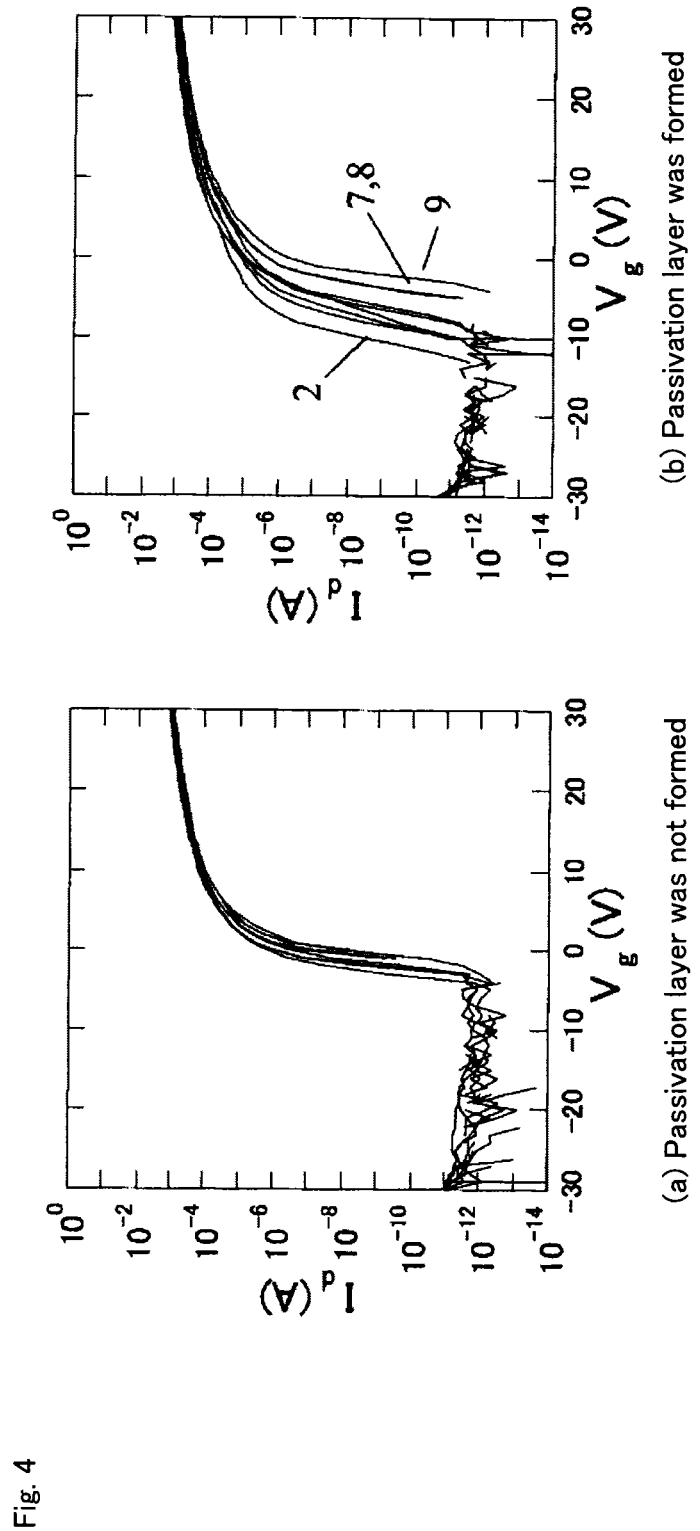
FIGS. 4(a) and 4(b) are graphs showing TFT characteristics before and after the formation of a passivation layer, respectively, when using an Example of the present invention (Zn—Sn—Si—O).

In contrast to this, as shown in Table 1 and FIG. 4 (described below), all the semiconductor layers each containing Si and each having an atomic ratio of [Si] to [Zn]+[Sn]+[Si] (i.e., a Si ratio) in the preferred range (i.e., from 0.01 to 0.30) of the present invention exhibited favorable characteristics before and after the formation of the passivation layer.

More specifically, No. 2 (before the formation of the passivation layer) and No. 4 (after the formation of the passivation layer), which are examples having a Si ratio as described above of 0.05, were found to be useful as switching devices because they exhibit favorable values without a large change in both mobility and S value before and after the formation of the passivation layer and the threshold voltage $V_{th}$ after the formation of the passivation layer was in a range of from −2 V to −10 V. Similarly, all of Nos. 5 to 8 (after the formation of the passivation layer) in which the Si ratio was changed in the preferred range of the present invention were also found to have favorable characteristics. In this regard, no data before the formation of the passivation layer are shown for Nos. 5 to 8 described above, but it was confirmed that all these examples have favorable characteristics.

On the other hand, No. 9 in which a Si ratio as described above was beyond the preferred upper limit (i.e., 0.30) of the present invention exhibited an inhibition in $V_{th}$ variation, but a decrease in mobility.

Further, No. 10 in which Ni was added in place of Si exhibited a low mobility and a large $V_{th}$ variation.

FIGS. 4(a) and 4(b) show the results obtained when samples having a Si ratio of 0.05 were used and a change in the distribution of TFT characteristics in the substrate surface was examined before and after the formation of the passivation layer in the same manner as described above in the case of FIG. 3. FIG. 4(a) is a graph showing the results before the formation of the passivation layer, and corresponds to No. 2 in Table 1 described above. FIG. 4(b) is a graph showing the results after the formation of the passivation layer, and corresponds to No. 4 in Table 1 described above. In FIG. 4(b), the numerals in this figure indicate the measurement points in FIG. 2 (i.e., points 1 to 9).

As can be seen from a comparison of FIG. 4(b) with FIG. 3(b) described above, which FIG. 3(b) corresponds to the case where Si was not added, the variation in the substrate surface after the formation of the passivation layer was avoided by the addition of Si, and favorable characteristics were obtained at all the points. In addition, the TFT characteristics after the formation of the passivation layer were found to be almost the same as those before the formation of the passivation layer (FIG. 4(a)).

From the results described above, it was found that the $V_{th}$ variation after the formation of the passivation layer was particularly able to be effectively inhibited, while maintaining high mobility and others, by the addition of Si in the preferred range into ZTO. In other words, it was confirmed that the addition of Si has a large contribution to the structure stabilization of ZTO-based oxide semiconductors and TFT characteristics cannot be deteriorated even in the process of forming a passivation layer, which process is liable to form oxygen defects.

Then, a discussion on Table 2 will be provided below. Table 2 shows the results after the formation of the passivation layer for some examples, in all of which a Si ratio as described above was set to 0.05 (constant) and a Zn ratio as described above was changed as shown in Table 2. In Table 2, "−" means impossibility of measurement.

As can be seen from Table 2, all of Nos. 1 to 5 exhibited favorable characteristics, in which cases the Zn ratio was controlled in the preferred range (i.e., 0.8 or lower) of the present invention. In contrast to this, No. 6 exhibited no switching characteristics because of its low mobility, in which case the Zn ratio was beyond the preferred upper limit of the present invention. This seems to be because the crystalline phase of Zn is formed with an increase in Zn ratio, thereby making it impossible to stably control the carrier concentration.

Figure 5:
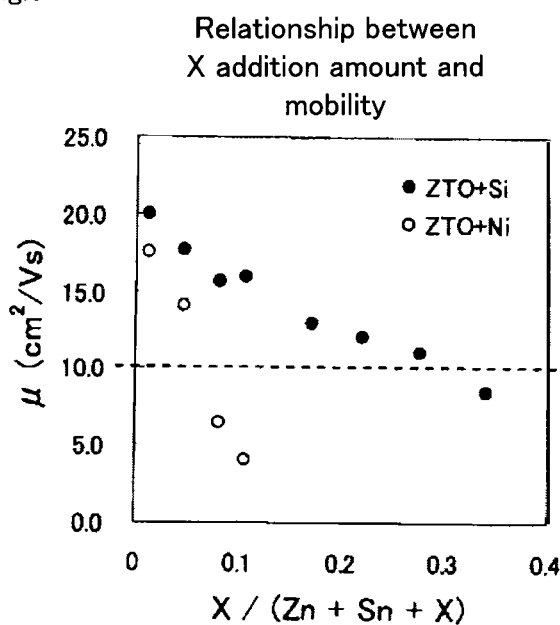
FIG. 5 is a graph showing a relationship between X addition amount and mobility in Zn—Sn—X—O (where X is Si or N).

Then, a discussion on FIG. 5 will be provided below. FIG. 5 is a graph showing the results examined for the effects that the addition amount of Si had on mobility. For comparison, this figure further shows the results when Ni was added in place of Si. More specifically, assuming that an element to be added to ZTO is an X element (where the X element is Si or Ni), mobility µ after the formation of a passivation layer was examined in the same manner as described above when the atomic ratio of [X] to [Zn]+[Sn]+[X] (i.e., the X ratio) was changed as shown in FIG. 5. In this regard, Zn ratio was 0.6 in all cases. Then, the condition that mobility µ was higher than 10 cm²/Vs was regarded as an indication of passing.

As shown in FIG. 5, when Ni was added, a drastic decrease in mobility was seen with an increase in the Ni ratio. This seems to be because Ni contained in an oxide semiconductor acts as an impurity scattering carriers.

In contrast to this, when Si was added, mobility was seen to have a tendency to decrease with an increase in the Si ratio, but the degree of mobility lowering was significantly smaller than the case of Ni; and it was found that even when the Si ratio is increased to 0.3 as the preferred upper limit of the present invention, mobility does not become lower than 10 cm²/Vs as an indication of passing. This seems to be because Si is placed at a stable lattice position not disturbing the motion of electrons and therefore the scattering of carriers becomes small, resulting in a difficulty of mobility lowering.

Taking into consideration all the experimental results described above, it has been demonstrated that high mobility can be achieved, even after the formation of a passivation layer, to thereby obtain favorable TFTs having less variation in a substrate surface, by the addition of Si as an X element and the control of the Si ratio and the Zn ratio to the respective preferred ranges.

In this regard, the oxides obtained by the addition of Si seem to have amorphous structures because wet etching processing was favorably carried out.

Example 2

In this Example, oxide films (having a thickness of 100 nm) were measured for density, which oxide films had been obtained using the oxide with a composition corresponding to No. 4 in Table 1 (i.e., Zn—Sn-5 at % Si—O, [Zn]:[Sn]=6:4, Zn ratio=[Zn]/([Zn]+[Sn])=0.6, Si ratio=[Si]/([Zn]+[Sn]+[Si])=0.05) and controlling pass pressure during the sputtering film formation to 1 mTorr or 5 mTorr. Further, with respect to TFTs produced in the same manner as described above in Example 1, carrier mobility (or field-effect mobility) was calculated using the expression described below. In this Example, those in which saturated mobility thus determined was 5 cm²/Vs or higher were considered as passing. Further, the amount of threshold voltage change ($\Delta V_{th}$) after the stress test (light illumination plus negative bias application) was examined. Their measurement methods are as follows:

$$I_d = \frac{1}{2}\mu_{FE}C_{OX}\frac{W}{L}(V_{gs} - V_{th})^2 \qquad \text{[Mathematical Expression 2]}$$

where $C_{ox}$ is the insulator layer capacitance;
W is the channel width;
L is the channel length; and
$V_{th}$ is the threshold voltage.

(Measurement of Density of Oxide Film)

The density of each oxide film was measured by XRR (X-ray reflectivity method). The detailed measurement conditions were as described below.

Analysis apparatus: Horizontal type X-ray diffraction apparatus Smart Lab available from Rigaku Co., Ltd.
Target: Cu (source: Kα ray)
Target output power: 45 kV, 200 mA
Preparation of Measurement Samples Each sample was prepared by forming a film (having a thickness of 100 nm) of each oxide having each composition on a glass substrate under the sputtering conditions described below, and then carrying out the same heat treatment as the pre-annealing treatment for simulation of the pre-annealing treatment in the TFT production process of Example 1 described above.

Sputtering gas pressure: 1 mTorr or 5 mTorr
Oxygen partial pressure: $O_2/(Ar+O_2)=2\%$
Film formation power density: DC 2.55 W/cm²
Heat treatment: 350° C. under an air atmosphere for 1 hour (Evaluation of Stress Resistance: Light Irradiation and Negative Bias Application as Stress)

In this Example, stress tests were carried out by irradiation of light while applying negative bias to a gate electrode for simulation of environments (stress) at the time of actual panel drive. The stress tests conditions were as described below. A light wavelength with about 400 nm was selected which was close to the band gap of an oxide semiconductor and with which the transistor characteristics tend to be easily fluctuated.

Gate voltage: −20V
Substrate temperature: 60° C.
Light stress
Wavelength: 400 nm
Illuminance (i.e., light intensity for irradiation to TFT): 0.1 μW/cm²
Light source: LED available from OPTOSUPPLY Ltd. (light quantity was adjusted by an ND filter)
Stress tests time: 3 hours More specifically, the threshold voltage ($V_{th}$) before and after stress application was measured according to the method as described above, and a difference thereof ($\Delta V_{th}$) was determined.

These results are shown in Table 3.

TABLE 3

| No. | Composition | Gas pressure during film formation (mTorr) | Density (g/cm³) | Mobility (cm²/Vs) | Δ Vth (V) |
|---|---|---|---|---|---|
| 1 | Same as No. 4 in Table 1 | 1 | 6.2 | 9.2 | −3.5 |
| 2 | | 5 | 5.8 | 5.8 | −5.8 |

As can be seen from Table 3, both the oxides in Table 3 containing Si as an X-group element defined in the present invention had their own high densities of 5.8 g/cm³ or higher. More specifically, the film density was 5.8 g/cm³ when the gas pressure was 5 mTorr (No. 2), whereas the film density was 6.2 g/cm³ when the gas pressure was 1 mTorr (No. 1), indicating that higher densities were obtained with a decrease in gas pressure. In addition, the absolute value of threshold voltage shift $\Delta V_{th}$ in the stress test was also decreased with an increase in film density.

From the experimental results described above, it was found that the density of an oxide film may vary with a gas pressure during sputtering film formation, and a decrease in such a gas pressure leads to an increase in film density, along which the field-effect mobility is also largely increased and the absolute value of threshold voltage shift $\Delta V_{th}$ in the stress test (light irradiation plus negative bias stress) is also decreased. This seems to be because the convulsion of sputtered atoms (or molecules) was inhibited by lowering gas pressure during the sputtering film formation to decrease the content of defects in the film, so that both mobility and electric conductivity were improved, resulting in an improvement in the stability of TFT.

The present application has been explained in detail by reference to specific embodiments, but it is evident to those skilled in the art to make various modifications or alterations without departing from the spirit and scope of the present invention.

The present application is based on Japanese Patent Application (JP 2010-172868) filed on Jul. 30, 2010 and Japanese Patent Application (JP 2011-008323) filed on Jan. 18, 2011, both contents of which are incorporated herein by reference in their entirety.

INDUSTRIAL APPLICABILITY

According to the present invention, ZTO-based oxides for semiconductor layers were obtained, which oxides can provide thin-film transistors with excellent switching characteristics. When the oxides for semiconductor layers according to the present invention are used, thin-film transistors can be provided, of which TFT characteristics can be prevented from being deteriorated by the formation of oxygen defects due to plasma damage, the diffusion of hydrogen from the passivation layers, and other factors, in the formation of the passivation layers on oxide semiconductor layers, thereby stably obtaining favorable characteristics. As a result, the use of thin-film transistors makes it possible to obtain highly-reliable display devices.

EXPLANATION OF REFERENCE NUMERALS

1 Substrate
2 Gate electrode
3 Gate insulator layer
4 Oxide semiconductor layer
5 Source-drain electrode
6 Passivation layer (or insulator layer)
7 Contact hole
8 Transparent conductive film

The invention claimed is:

1. An oxide comprising Zn, Sn, and Si, wherein:
a ratio of [Zn]/([Zn]+[Sn]) is from 0.2 to 0.8, and
a ratio of [Si]/([Zn]+[Sn]+[Si]) is from 0.01 to 0.10,
wherein [Zn], [Sn], and [Si] are the content in atomic % of Zn, Sn, and Si, respectively, contained in the oxide.

2. A thin-film transistor, comprising a semiconductor layer comprising the oxide of claim 1.

3. The thin-film transistor of claim 2, wherein the semiconductor layer has a density of 5.8 g/cm³ or higher.

4. The thin-film transistor of claim 3, wherein the semiconductor layer has a density of 5.9 g/cm³ or higher.

5. The thin-film transistor of claim 3, wherein the semiconductor layer has a density of 6.0 g/cm³ or higher.

6. The oxide of claim 1, wherein the ratio, [Zn]/([Zn]+[Sn]), is from 0.3 to 0.75.

7. A sputtering target, comprising Zn, Sn, and Si, wherein:
a ratio of [Zn]/([Zn]+[Sn]) is from 0.2 to 0.8, and
a ratio of [Si]/([Zn]+[Sn]+[Si]) is from 0.01 to 0.10,
wherein [Zn], [Sn], and [Si] are the content in atomic % of Zn, Sn, and Si, respectively, contained in the sputtering target.

8. The sputtering target of claim 7, wherein the ratio, [Zn]/([Zn]+[Sn]), is from 0.3 to 0.75.

* * * * *